(12) United States Patent
Zundel

(10) Patent No.: US 7,675,114 B2  
(45) Date of Patent: Mar. 9, 2010

(54) TRENCH TRANSISTOR WITH INCREASED AVALANCHE STRENGTH

(75) Inventor: Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 803 days.

(21) Appl. No.: 11/393,092

(22) Filed: Mar. 30, 2006

(65) Prior Publication Data

US 2006/0278922 A1    Dec. 14, 2006

(30) Foreign Application Priority Data

Mar. 31, 2005    (DE) .................. 10 2005 014 744

(51) Int. Cl.
- *H01L 29/94* (2006.01)
- *H01L 31/113* (2006.01)

(52) U.S. Cl. .............. 257/331; 257/330; 257/332; 257/344; 438/270; 438/271; 438/330

(58) Field of Classification Search .............. 257/331, 257/332, 330, 344; 438/270, 271, 330
See application file for complete search history.

(56) References Cited

U.S. PATENT DOCUMENTS

| | | | | |
|---|---|---|---|---|
| 6,262,453 B1 * | 7/2001 | Hshieh | ........... | 257/341 |
| 6,285,060 B1 | 9/2001 | Korec et al. | | |
| 2003/0173618 A1 * | 9/2003 | Zundel et al. | ........... | 257/329 |
| 2004/0026737 A1 * | 2/2004 | Zundel et al. | ........... | 257/330 |
| 2005/0133861 A1 * | 6/2005 | Mizokuchi et al. | ......... | 257/330 |

FOREIGN PATENT DOCUMENTS

| | | |
|---|---|---|
| DE | 102 07 309 | 9/2003 |
| DE | 102 23 699 | 12/2003 |
| EP | 1 168 455 | 1/2002 |

\* cited by examiner

*Primary Examiner*—Kenneth A Parker  
*Assistant Examiner*—Joseph Nguyen  
(74) *Attorney, Agent, or Firm*—Dicke, Billig & Czaja, PLLC

(57) ABSTRACT

In order to obtain an increased avalanche strength, a trench transistor is proposed in which the breakdown location is defined in a trench bottom region below body contact zones. This is done by means of a modulation of the dopant concentration in a drift zone and an insulation layer thickness modulation in the bottom region of the trenches.

22 Claims, 4 Drawing Sheets

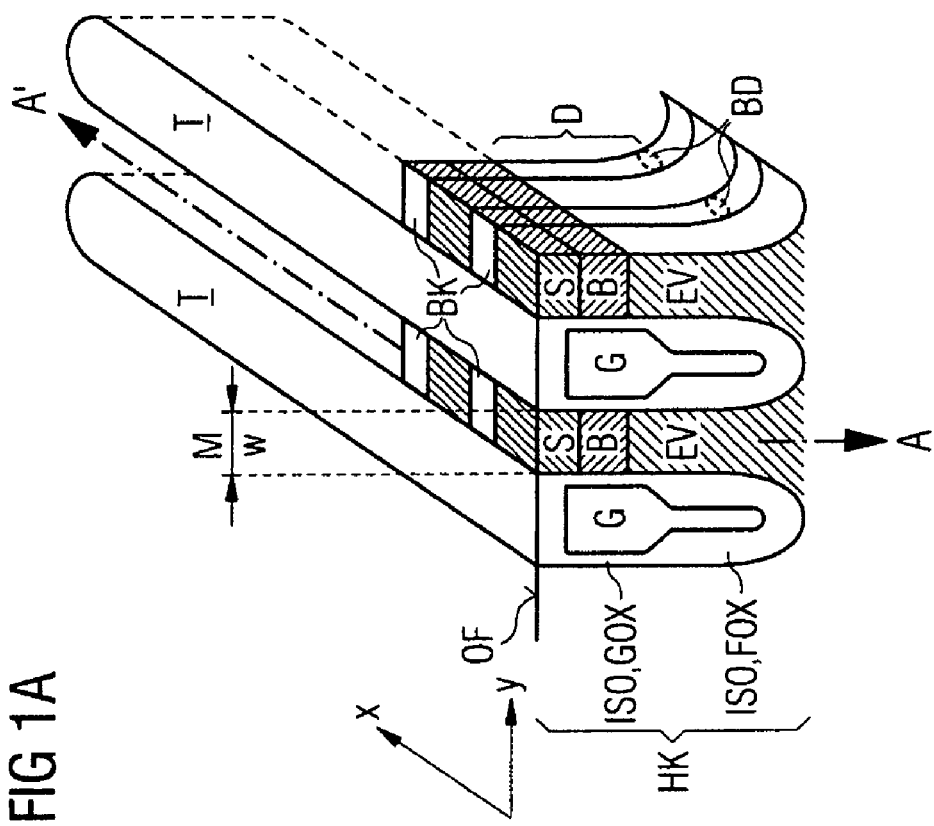
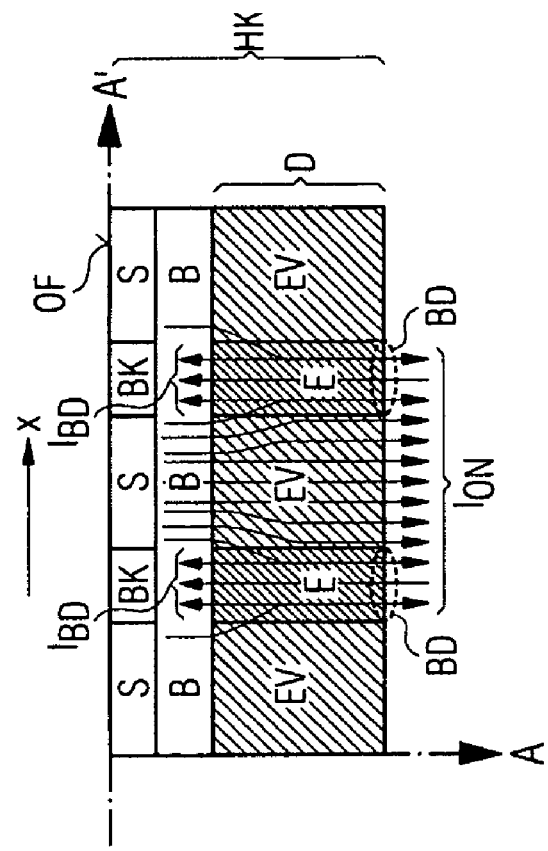
FIG 1A
FIG 1B

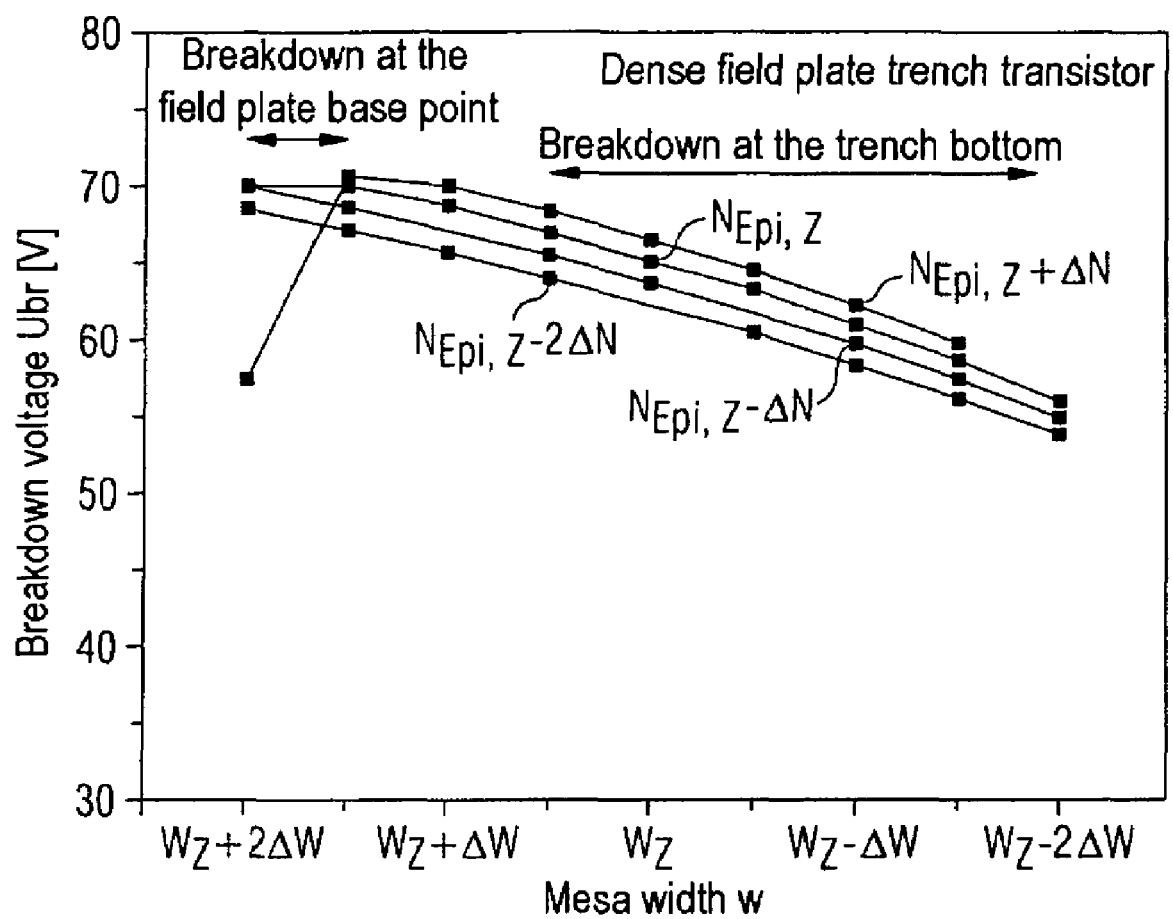

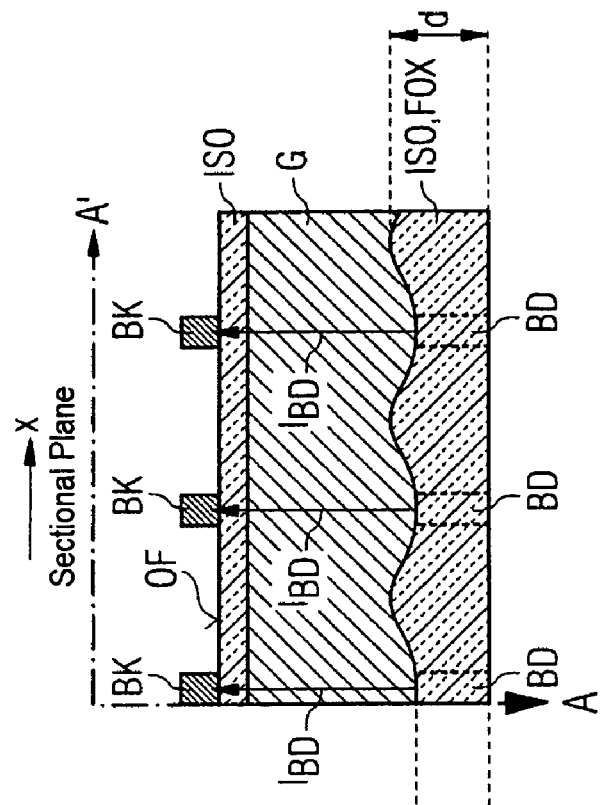
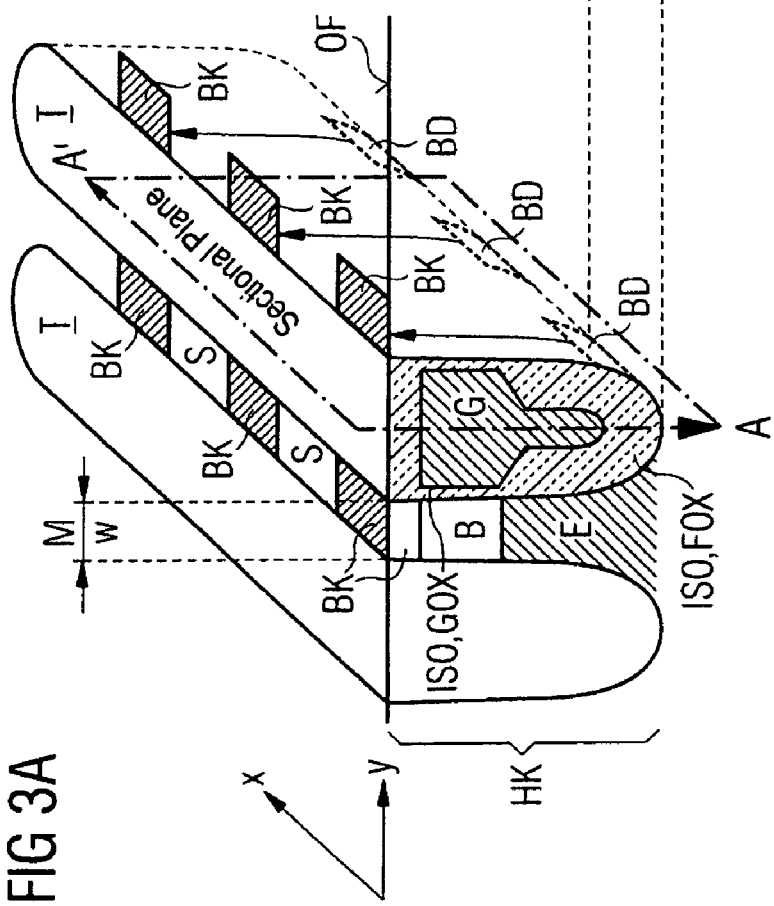
FIG 3A
FIG 3B

TRENCH TRANSISTOR WITH INCREASED AVALANCHE STRENGTH

CROSS-REFERENCE TO RELATED APPLICATIONS

This Utility Patent Application claims priority to German Patent Application No. DE 10 2005 014 744.5, filed on Mar. 31, 2005, which is incorporated herein by reference.

BACKGROUND

One embodiment of the invention relates to a trench transistor. The development of new generations of DMOS power transistors, in particular of trench transistors, is driven by the reduction of the on resistivity $R_{on} \cdot A$. Since controlled breakdown properties and a high avalanche strength are also desirable besides the low $R_{on} \cdot A$, it is necessary to optimize the transistor cells but also the chip edge of trench transistors, in particular of dense trench transistors. Dense trench transistors are distinguished by such a narrow mesa zone that the breakdown location lies in the trench bottom region.

DE 102 07 309 describes a dense trench transistor having a breakdown zone at the trench bottom, which extends along the entire trench strip. Charge carriers generated there lead to a voltage drop along the body zone in the case of an electrical breakdown on account of a breakdown current. The body zone constitutes the base of a parasitic bipolar transistor, the emitter of which is formed by the source zones and the collector of which is formed by the drift zones. As the current density increases in breakdown operation, the voltage drop across the body zone reaches the order of magnitude of a diode forward voltage, so that the parasitic bipolar transistor turns on. The positive temperature coefficient of this transistor current leads to the destruction of the component as a result of overheating.

One known possibility for reducing the voltage drop across the body zone and thus counteracting the turning on of the parasitic bipolar transistor is afforded by a locally formed body reinforcement extending into the depth. In this case, the charge carriers generated along the bottom regions of the trench strips are extensively extracted, so that only a small voltage drop builds up along the body zone acting as parasitic base of the bipolar transistor. However, said body reinforcement extending into the depth takes up a large amount of space on account of its lateral variation during implantation and the subsequent lateral outdiffusion, so that this space is lost for the channel width. The capacitances formed in the region of the body reinforcement are likewise maintained, so that the figure of merit FOM (product of $R_{on} \cdot A \cdot Q_{Gate}/A$ where $R_{on}$ is the on resistance, A is the transistor area and $Q_{Gate}/A$ is the gate charge $Q_{Gate}$ relative to the oxide transistor area A) assumes disadvantageous values.

A further possibility for improving the avalanche behavior of a dense trench transistor is described in DE 102 23 699. In this case, the trench and mesa width are varied along the trench strips in the dense trench region, so that the breakdown region can be defined at specific locations along the trench strips at the trench bottom. If this definition of the breakdown regions is combined with a corresponding positioning of the body contact zones, then it is possible, in breakdown operation/avalanche operation, for the charge carriers generated at the defined breakdown regions to be extracted without a voltage drop being built up along the body zone. In practice, however, it has been shown that a targeted modulation of the trench width and of the mesa width is difficult to implement since oxidations for rounding purposes are often used in the process sequence in order to avoid corners within the trench. The consequence of such oxidations is that predetermined trench width and mesa width modulations form only to a very small extent at the silicon surface and virtually do not form in the trench bottom region.

SUMMARY

One embodiment of the invention provides a trench transistor with increased avalanche strength and also a method for fabricating it.

In order to obtain an increased avalanche strength, a trench transistor is proposed in which the breakdown location is defined in a trench bottom region below body contact zones. This is done by means of a modulation of the dopant concentration in a drift zone and an insulation layer thickness modulation in the bottom region of the trenches.

One embodiment of the invention is a trench transistor including trenches, an insulation layer, a gate electrode, mesa zones and a body zone. The trenches are formed within a semiconductor body of a first conductivity type along a first direction and are adjacent along a second direction, which is perpendicular to the first direction. The insulation layer adjoining the semiconductor body within the trenches. The gate electrode adjoins the insulation layer within the trenches. The mesa zones are formed between the trenches and have drift zones of the first conductivity type. The body zone is formed in the mesa zones above the drift zones and are of a second conductivity type opposite to the first conductivity type. The body zone is formed with body contact zones of the second conductivity type and source zones of the first conductivity type that extend to a surface of the semiconductor body. A breakdown is formed in the mesa zones for increasing the avalanche strength below the body contact zones in a depth lying in the region of the trench bottoms.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A is a schematically illustrated view of a first embodiment of the trench transistor according to the invention.

FIG. 1B illustrates a schematic cross-sectional view in the cross-sectional plane A-A' of the trench transistor as illustrated in FIG. 1A.

FIG. 2 is a diagram illustrating a breakdown voltage $U_{br}$ of a dense trench transistor as a function of a mesa width w and of a dopant concentration of an epitaxial layer in a drift zone.

FIG. 3A illustrates a schematic view of a second embodiment of the trench transistor according to the invention.

FIG. 3B illustrates a schematic cross-sectional view in the sectional plane A-A' of the trench transistor according to the invention as illustrated in FIG. 3A.

DETAILED DESCRIPTION

Figure 4:
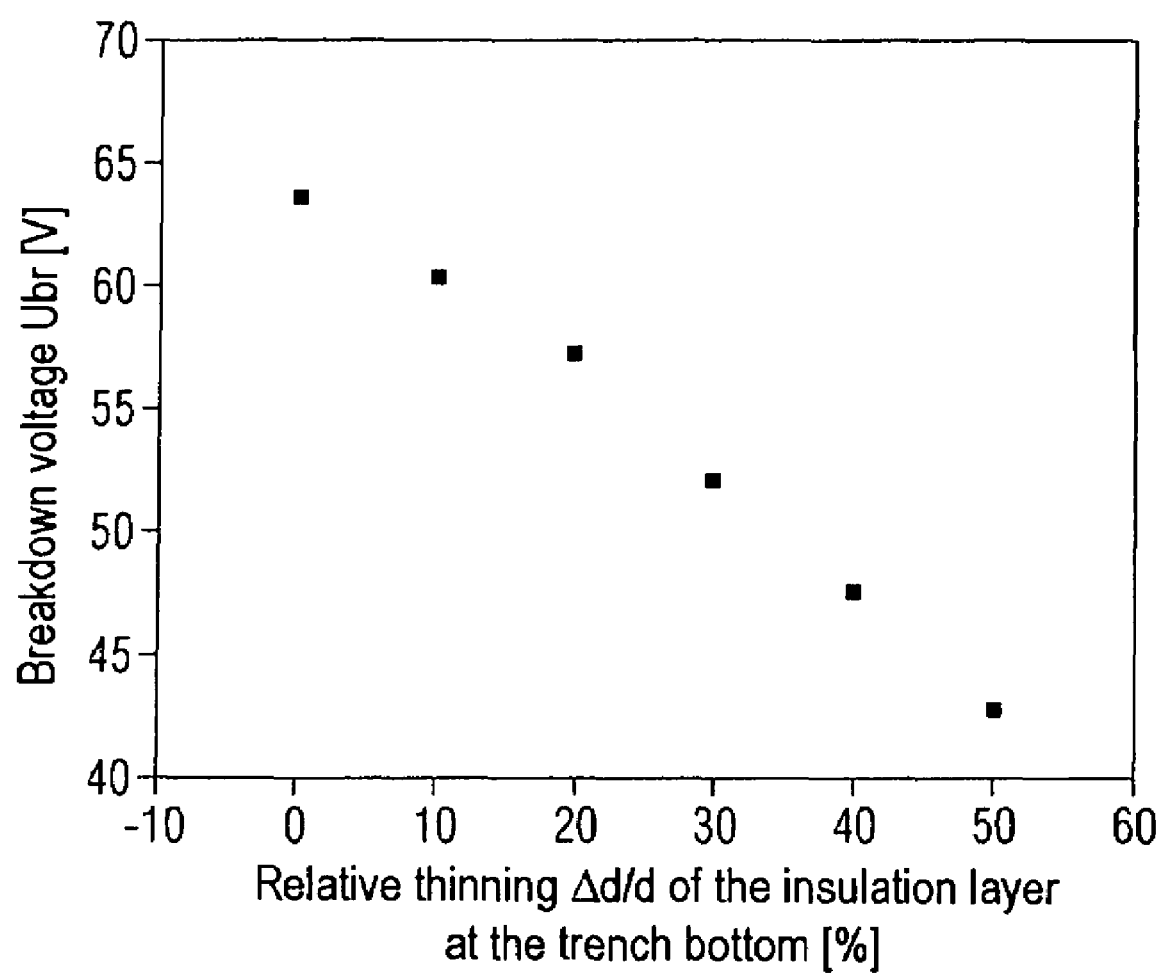
FIG. 4 is a diagram illustrating the breakdown voltage $U_{br}$ of a dense trench transistor as a function of a relative thinning $\Delta d/d$ of an insulation layer at the trench bottom.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One embodiment of the invention describes a trench transistor including trenches that are formed within a semiconductor body of a first conductivity type along a first direction and are adjacent along a second direction, which is perpendicular to the first direction, an insulation layer adjoining the semiconductor body within the trenches, a gate electrode adjoining the insulation layer within the trenches, mesa zones formed between the trenches, said mesa zones having drift zones of the first conductivity type, and a body zone—formed in the mesa zones above the drift zones—of a second conductivity type—opposite to the first conductivity type—with body contact zones of the second conductivity type and source zones of the first conductivity type which extend to a surface of the semiconductor body. The breakdown location of the avalanche breakdown is formed in the mesa zones for increasing the avalanche strength, in one case below the body contact zones in a depth lying in the region of the trench bottoms. A breakdown location that is in one case localized below the body contact zones in the trench bottom region leads to a vertical current flow into the body contact zones, thereby considerably reducing a voltage drop caused by a breakdown current along the body zones below the source zones. Consequently, a premature turning on of the parasitic bipolar transistor is avoided and the avalanche strength of the trench transistor is increased.

In a first embodiment of the invention, a concentration of dopants for increasing the conductivity of the first conductivity type within the drift zones is chosen to be greater in a preferred conducting-state region essentially formed from the bottom of the trenches as far as the body zones below the source zones than in a preferred breakdown region correspondingly formed below the body contact zones. Since a lowering of the dopant concentration within the drift zones leads to a reduction of the breakdown voltage in the dense trench transistor regime, such an alternate profile of the dopant concentration makes it possible to define the avalanche breakdown along the first direction in the preferred breakdown region. This results in the increase in the avalanche strength as described in the introduction since the parasitic transistor, on account of the small voltage drop along the body zones acting as base, can only be turned on at comparatively high breakdown currents. The increase in the dopant concentration in a preferred conducting-state region formed below the source zones additionally entails an increase in the conductivity within the drift zone, accompanying the increased dopant concentration, leading to a reduction of the on resistance of the trench transistor.

In a second embodiment, a thickness of the insulation layer is smaller in a bottom region of the trenches that is adjacent to the body contact zones in the second direction than in a bottom region that is adjacent to the source zones in the second direction. Consequently, the thickness of the insulation layer alternates in the bottom region of the trenches along the first direction. Since an increase in the thickness of the insulation layer, for example the field oxide thickness, in the trench bottom region leads to a lowering of the breakdown voltage in the trench bottom region, it is thus possible to define the breakdown location at desired locations along the trenches in the first direction. An increase in the thickness of the insulation layer in a bottom region that is adjacent to the body contact zones in the second direction compared with a bottom region that is correspondingly adjacent to the source contact zones defines the breakdown of the trench transistor along the first direction below the body contact zones in the trench bottom region. As described in the previous two sections, it is thus possible to improve the avalanche strength of the trench transistor by virtue of making it more difficult for the parasitic bipolar transistor to be turned on.

In one embodiment the body contact zones and the source zones are arranged alternately along the first direction.

In one embodiment the concentration of the dopants is chosen to be smaller by essentially 10% to 40% in the preferred breakdown region than in the preferred conducting-state region. Consequently, it is possible to decrease the breakdown voltage in the preferred breakdown region below the body contact zones by a few % to a few 10%.

In one embodiment the thickness of the insulation layer is chosen to be smaller by essentially 10% in a bottom region of the trenches that is adjacent to the body contact zones in the second direction than in a bottom region that is adjacent to the source zones in the second direction. With such a thickness modulation of the insulation layer, it is possible to decrease the breakdown voltage in mesa regions below the body contact zones by a few % to a few 10% in the same way as for the modulation of the dopant concentration. In this case, the breakdown always occurs in a depth of the trench bottom region. If the thickness modulation of the insulation layer is combined with the alternate profile of the dopant concentration along the first direction, then this enables the breakdown to be defined in a flexible manner.

In one embodiment, a lowering of the dopant concentration in the preferred breakdown region and an increase in the thickness of the insulation layer in a bottom region of the trenches that is adjacent to the preferred breakdown region in the second direction are combined with a smaller width of the mesa zones in the region of the body contact zones compared with the width in the region of the source zones. Such a modulation of the width of the mesa zones along the first direction affords a further possibility of defining the breakdown location below the body contact zones in the trench bottom region, and, in combination with the thickness modulation of the insulation layer and/or the alternate profile of the dopant concentration, enables an advantageous, flexible definition of the breakdown location in the trench transistor. A reduction of the width of the mesa zones may accompany a corresponding widening of the trenches that are adjacent in the second direction. This leads to a modulation of the width of the mesa zones and of the trenches along the first direction. It is likewise possible to keep constant the trench width along the first direction despite a widening of the mesa zones. This can be obtained for example by arranging the widened regions of adjacent mesa zones along the first direction in a manner offset with respect to one another.

In one embodiment the semiconductor body is formed from a semiconductor substrate with an applied epitaxial layer of in each case the first conductivity type, the dopant concentration in the epitaxial layer being lower than the dopant concentration in the semiconductor substrate. In this way, it is possible for example to realize a transistor with a vertical current flow which has both a high dielectric strength and a low on resistance. In this case, the epitaxial layer serves for taking up the voltage and the more highly doped semiconductor substrate contributes to the low on resistance. The semiconductor body, that is to say the epitaxial layer and the semiconductor substrate, are in one case composed of silicon. However, it is likewise conceivable to use a semiconductor material that is different from silicon, for example SiGe, Ge or a III/V semiconductor such as GaAs.

In one embodiment, the insulation layer within the trenches is formed such that it is essentially thicker below a penetration depth of the body zones than above said penetration depth. By way of example, a field oxide for taking up the voltage is provided below the penetration depth and a gate insulation layer, for example a gate oxide, which adjoins the body contact and source zones in the second direction and is comparatively thin with respect to the thickness of the field oxide is formed above the penetration depth.

One embodiment has a plurality of electrodes within the trenches. Consequently, alongside the gate electrode, one or more further electrodes are formed within the trenches. Said electrodes may be connected to different potentials. By way of example, the gate-drain capacitance can be lowered by a further electrode in the trench bottom region, which is connected to the source potential, in comparison with a gate electrode that extends right into the trench bottom region.

In one embodiment, a further electrode is formed for the lateral connection of the body contact zones and of the source zones within the trenches. Such a further electrode within the trench can be insulated from the gate electrode by an insulation layer. It is likewise possible to form the further electrode above the gate electrode, by way of example. A lateral connection of the body contact zones and of the source zones makes it possible to provide dense trench transistors which are distinguished by particularly narrow mesa zones. Since contact is made with the body contact and source zones laterally, vertical contact-making, for example via contact holes, is not necessary. Consequently, no requirements are made either with regard to minimum mesa widths for vertical contact-making, thereby facilitating a reduction of the mesa width.

In one embodiment, the first and the second direction are an x and a y direction of a system of Cartesian coordinates lying parallel to the surface of the semiconductor body. The trench transistor can thus be formed as a cell array having trench strips which extend in the x direction and are adjacent lying parallel to one another in the y direction.

In one embodiment the first direction forms a radial direction and the second direction forms an azimuthal direction of a system of polar coordinates lying parallel to the surface. Consequently, the trenches are formed in circular fashion in the semiconductor body and are radially adjacent to one another. It shall expressly be pointed out at this juncture that the description of the trenches with the aid of the first and second directions may also be related to partial regions of the trench transistor, that is to say trench arrangements in the semiconductor body as polygons, for example octahedral geometry, which may be adjacent to one another or else interleaved in one another, and also trenches that are radially adjacent to one another and form a circle sector or an annulus sector are possible.

In one embodiment, the trench transistor is formed as a dense trench transistor.

In one embodiment, an increase in the concentration of the dopants in the conducting-state region is provided by an implantation of dopants by means of a photolithographically patterned implantation mask.

In one embodiment a source mask serves for forming the source zones to be used for patterning the implantation mask. In this way, a mask that is present in the process sequence can be used and it is not necessary to create a new mask causing additional costs.

In one embodiment, the implantation for increasing the concentration of the dopants in the conducting-state region can be obtained as a high-energy implantation with an implantation depth in a range of 2 μm to 20 μm. By way of example, phosphorus may be implanted as the dopant for increasing the concentration and the conductivity of the n type in the preferred conducting-state region EV. However, it is likewise conceivable to implant further elements or element compounds that increase the n-type conductivity, such as antimony or arsenic for example. By way of example, boron or further element compounds or elements that increase the p-type conductivity may be used for increasing the concentration and also the conductivity of the p type in the preferred conducting-state region EV of p-type drift zones.

In one embodiment, the insulation layer is thickened in the bottom regions of the trenches that are adjacent to the source zones in the second direction by carrying out, with the aid of high density plasma etch, a material displacement of part of the insulation layer from a region of the trenches in the vicinity of the surface into the bottom region to be thickened. In order, however, to obtain a thickening of the insulation layer only in the bottom regions of the trenches that are adjacent to the source zones in the second direction, the bottom regions of the trenches that are adjacent to the body contact zones in the second direction are masked. This is done using a photolithographically patterned mask on the insulation layer in the corresponding regions. Consequently, parts of the insulation layer that is removed in the surface region deposit only on the mask, which, however, is removed in a later step. Consequently, the thickness of the insulation layer is preserved in the bottom regions of the trenches that are adjacent to the body contact zones in the second direction, despite a high density plasma etch for material displacement.

FIG. 1A illustrates a schematic view of a first embodiment of the dense trench transistor according to the invention. Trenches T formed in strip-type fashion along an x direction in a semiconductor body HK of a first conductivity type are spaced apart from one another in a y direction by a mesa zone M having the width w. The mesa zone M has source zones S and body contact zones BK which are arranged alternately in the x direction and extend to a surface OF of the semiconductor body HK.

The source zones S are of a first conductivity type, which is opposite to a second conductivity type of the body contact zones BK. The first conductivity type may be either of the n type or of the p type. Accordingly, the opposite second conductivity type is of the p type or of the n type. The body contact zones BK serve for the connection of a body zone B that embeds the body contact zones BK and the source zones S and penetrates comparatively deeper into the semiconductor body HK. The body zone B is of the second conductivity type and defines a length of a channel region of the trench transistor that extends perpendicular to the x and y directions.

Below the body zone B, a drift zone D of the first conductivity type is formed within the mesa region M, which drift zone is formed with a greater dopant concentration in a region below the source zones S in a preferred conducting-state region EV in comparison with a breakdown region E formed below the body contact zones BK. The preferred conducting-state regions EV and the preferred breakdown regions E may be formed as an epitaxial layer, it being possible to provide the increase in the dopant concentration in the conducting-state regions EV for example by means of ion implantation of a suitable dopant.

The breakdown that occurs in a trench bottom region in dense trench transistors is localized, owing to the preferred breakdown regions E that are doped comparatively more lightly in comparison with the preferred conducting-state regions EV, at breakdown locations BD in the trench bottom region of the preferred breakdown regions E, that is to say below the body contact zones BK. Accordingly, an avalanche current generated in breakdown flows from the breakdown locations BD vertically upward into the body contact zones BK and thus generates a small voltage drop along the body zone B in the x direction. This suppresses a turning on of the parasitic bipolar transistor comprising an emitter provided by the source zones S and a base determined by the body zones B. Since a turning on of said parasitic bipolar transistor leads to the destruction of the trench transistor and thus limits the avalanche strength of the component, it is thus possible to increase the strength of the trench transistor in avalanche breakdown. It should be pointed out that although the parasitic bipolar transistor cannot be prevented from turning on by means of the measure described, it is turned on only at significantly higher avalanche currents in comparison with customary trench transistors.

FIG. 1B illustrates a cross-sectional view of the dense trench transistor illustrated in FIG. 1 in the cross-sectional plane A-A' through the mesa zone M. Besides the source zones S and body contact zones BK that are embedded alternately into the body zone B along the x direction in the semiconductor body HK, the illustration illustrates the preferred conducting-state regions EV and preferred breakdown regions E that are formed alternately in the drift zone D along the x direction. In this case, the preferred conducting-state regions EV are arranged below the source zones S and the breakdown regions E are arranged below the body contact zones BK. The breakdown locations BD in the trench bottom region lie below the body contact zones BK at the bottom of the preferred breakdown regions E.

If the dense trench transistor is in a switched-on state, then this leads to a vertical current flow, represented with the aid of current flow lines $I_{on}$. A current emerging from the source zone S flows vertically along the inversion channel formed in the body zone B into the drift zone D and from there on into a drain electrode (not illustrated). Owing to the dopant concentration that is made comparatively higher in the preferred conducting-state regions EV in comparison with the preferred breakdown regions E, the conductivity is greater in the preferred conducting-state regions EV than in the preferred breakdown regions E. Consequently, a current distribution $I_{on}$ emerging vertically downward from a source zone laterally extends only a little laterally into the preferred breakdown regions E. An increase in the dopant concentration, and hence the conductivity of the conducting-state regions EV, provides a lowering of the on resistance of the dense trench transistor. A lowering of said on resistance is based on the drift zone D making a lower resistance contribution—brought about by the increase in the dopant concentration in the preferred conducting-state region EV—to the on resistance $R_{on}$, which is composed of a plurality of contributions, for example from channel or substrate.

A current distribution $I_{BD}$ generated in breakdown in the breakdown locations BD at a depth of the trench bottom region of the preferred breakdown regions E flows essentially vertically upward into the body contact zones BK. Since the distribution—shown in breakdown—of the current flow lines $I_{BD}$ leads essentially vertically from the bottom through the body contact zones, there is a lack of corresponding lateral current components along the x direction in the body zone B below the source zones S which would lead to a voltage drop in the body zone B relative to the source zones S and thus to a turning on of the parasitic bipolar transistor. This situation where the parasitic bipolar transistor is turned on with more difficulty leads to the increase in the avalanche strength of the dense trench transistor.

FIG. 2 illustrates simulated breakdown voltages $U_{br}$ (in volts) of a dense field plate trench transistor against the width w of the mesa zone. A target value of the width of the mesa zone is designated as $w_z$, and $\Delta w$ corresponds to a change in the width of the mesa zone. A reduction of the mesa width w leads to a reduction of the breakdown voltage $U_{br}$. The simulations were carried out inter alia for dense field plate trench transistors having typical values of the mesa width w in the range of $w_z - 2\Delta w$ to $w_z + \Delta w$. In this range, the breakdown was effected at the trench bottom in the simulation. With the mesa width w being increased above $w_z + \Delta w$, the breakdown was effected at a field plate base point, that is to say in the region of the transition between a gate oxide layer GOX—which is formed in the trench T and adjoins a gate electrode G—and a field oxide layer FOX (see, for instance, FIG. 1A) of the dense field plate trench transistor. The dopant concentration $N_{Epi}$ in the drift zone D formed as an epitaxial layer served as the family parameter of the different curve profiles illustrated. A target value of the dopant concentration of the epitaxial layer is designated as $N_{Epi,z}$, and $\Delta N_{Epi}$ corresponds to a change in the dopant concentration. A lowering of the dopant concentration $N_{Epi}$ leads to a reduction of the breakdown voltage $U_{br}$. By reducing $N_{Epi}$ from $N_{Epi,z} + \Delta N_{Epi}$ to $N_{Epi,z} - 2\Delta N_{Epi}$, it is possible to achieve a lowering of the breakdown voltage $U_{br}$ from 68 volts to approximately 64 volts given a mesa width $w_z$. The first embodiment of a trench transistor with increased avalanche strength as illustrated and described above with the aid of FIGS. 1A and 1B can thus be provided by increasing the dopant concentration in the preferred conducting-state regions EV compared with the dopant concentration in the preferred breakdown regions E.

FIG. 3A illustrates a schematic view of a second embodiment of the trench transistor according to the invention. Said second embodiment differs from the first embodiment as illustrated in FIG. 1A by virtue of the fact that the dopant concentration within the drift zone D has no modulation along the x direction. Consequently, the mesa zone M is distinguished by a common conducting-state region E lying below the body zone B. The body zone B and also the body contact zones BK and source zones S arranged alternately along the x direction are arranged as in the cross-sectional view of the first embodiment as illustrated in FIG. 1A. In order to define the breakdown below the body contact zones BK, a thickness d of the insulation layer ISO is modulated in the trench bottom region of the trenches T along the x direction. Since a reduction of the insulation layer thickness d brings about a lowering of the breakdown voltage, the insulation layer thickness d is chosen to be smaller in a trench bottom region of the trenches T that is adjacent to the body contact zones BK in the y direction than in a trench bottom region that is adjacent to the source zones S in the y direction. Consequently, modulation of the insulation layer thickness d in the trench bottom region along the x direction defines the breakdown of the dense trench transistor at breakdown locations BD in the trench bottom region below the body contact zones BK. The associated situation where it is more difficult for the parasitic bipolar transistor to be turned on leads to the increase in the avalanche strength of the dense trench transistor.

FIG. 3B illustrates a cross-sectional view of the dense trench transistor illustrated in FIG. 3A in the sectional plane A-A', which represents a section through a trench T along the x direction. The body contact zones BK along the x direction are likewise represented for illustration purposes. The section is effected in the trench center, so that the gate electrode G and also the insulation layer ISO formed toward the surface OF can be discerned. The insulation layer ISO formed as a field oxide FOX exhibits, in the trench bottom region, the profile of the insulation layer thickness d that is formed in modulated fashion along the x direction. The field oxide FOX has a minimum insulation layer thickness d below the body contact zones BK in the trench bottom region. Consequently, the breakdown location BD is fixed at these locations in the trench bottom region. The current flow distribution $I_{BD}$ in breakdown is directed vertically into the body contact zones BK. Current components along the x direction that would lead to a voltage drop along the body zone B and hence to a turning on of the parasitic bipolar transistor are thus suppressed. This results in the rise in the avalanche strength.

FIG. 4 illustrates simulated breakdown voltages $U_{br}$ (in volts) as a function of the relative thinning $\Delta d/d$ (in %) of the insulation layer ISO at the trench bottom of a dense trench transistor. It is possible to discern an approximately linear decrease in the breakdown voltage $U_{br}$ with the relative thinning $\Delta d/d$. A relative thinning $\Delta d/d$ of the insulation layer ISO at the trench bottom of 50% leads to a decrease in the breakdown voltage $U_{br}$ from approximately 64 V to approximately 43 V, that is to say to a decrease in the breakdown voltage $U_{br}$ by approximately 33%. The dependence of the breakdown voltage $U_{br}$ on the relative thinning $\Delta d/d$ of the insulation layer ISO at the trench bottom as illustrated with the aid of simulation results in FIG. 4 is utilized according to the invention for increasing the avalanche strength in the second embodiment of the trench transistor as illustrated and described above with the aid of FIGS. 3A and 3B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A trench transistor comprising:
    trenches formed within a semiconductor body of a first conductivity type along a first direction and adjacent along a second direction, which is perpendicular to the first direction;
    an insulation layer adjoining the semiconductor body within the trenches;
    a gate electrode adjoining the insulation layer within the trenches;
    mesa zones formed between the trenches, said mesa zones having drift zones of the first conductivity type;
    a body zone formed in the mesa zones above the drift zones, the body zone formed of a second conductivity type opposite to the first conductivity type and with body contact zones of the second conductivity type and source zones of the first conductivity type that extend to a surface of the semiconductor body; and
    means for forming a breakdown in the mesa zones to increase the avalanche strength below the body contact zones in a depth lying in the region of the trench bottoms;
    wherein a concentration of dopants for increasing the conductivity of the first conductivity type within the drift zones is greater in a conducting-state region formed from the bottom of the trenches as far as the body zones below the source zones than in a breakdown region formed below the body contact zones.

2. A trench transistor comprising:
    trenches formed within a semiconductor body of a first conductivity type along a first direction and adjacent along a second direction, which is perpendicular to the first direction;
    an insulation layer adjoining the semiconductor body within the trenches;
    a gate electrode adjoining the insulation layer within the trenches;
    mesa zones formed between the trenches, said mesa zones having drift zones of the first conductivity type;
    a body zone formed in the mesa zones above the drift zones, the body zone formed of a second conductivity type opposite to the first conductivity type and with body contact zones of the second conductivity type and source zones of the first conductivity type that extend to a surface of the semiconductor body; and
    wherein the breakdown is formed in the mesa zones for increasing the avalanche strength below the body contact zones in a depth lying in the region of the trench bottoms, a concentration of dopants for increasing the conductivity of the first conductivity type within the drift zones is greater in a preferred conducting-state region essentially formed from the bottom of the trenches as far as the body zones below the source zones than in a preferred breakdown region formed below the body contact zones.

3. The trench transistor of claim 2, wherein the body contact zones and the source zones are arranged alternately along the first direction.

4. The trench transistor of claim 2, wherein the concentration of the dopants for increasing the conductivity of the first conductivity type is smaller by essentially 10% to 40% in the preferred breakdown region than in the preferred conducting-state region.

5. The trench transistor of claim 2, wherein the mesa zones have a smaller width in the region of the body contact zones than in the region of the source zones.

6. The trench transistor of claim 2, wherein:
    the semiconductor body comprises a semiconductor substrate and an epitaxial layer of in each case the first conductivity type; and
    the dopant concentration in the epitaxial layer is comparatively lower than the dopant concentration in the semiconductor substrate.

7. The trench transistor of claim 2, wherein:
    the body zones are formed as far as a penetration depth in the semiconductor body; and
    the insulation layer within the trenches is formed such that it is essentially thicker below the penetration depth of the body zones than above the penetration depth.

8. The trench transistor of claim 2, wherein a plurality of electrodes insulated from one another are formed within the trenches.

9. The trench transistor of claim 2, wherein a further electrode for the lateral connection of the body contact zones and of the source zones is formed within the trenches.

10. The trench transistor of claim 2, wherein the first and the second direction form an x and a y direction of a system of Cartesian coordinates lying parallel to the surface of the semiconductor body.

11. The trench transistor of claim 2, wherein the first direction and the second direction form a radial and an azimuthal direction of a system of polar coordinates lying parallel to the surface of the semiconductor body.

12. The trench transistor of claim 2, wherein the trench transistor is a dense trench transistor.

13. The trench transistor of claim 2, wherein the first and the second direction form an x and a y direction of a system of Cartesian coordinates lying parallel to the surface of the semiconductor body.

14. The trench transistor of claim 2, wherein the first direction and the second direction form a radial and an azimuthal direction of a system of polar coordinates lying parallel to the surface of the semiconductor body.

15. The trench transistor of claim 2, wherein the trench transistor is a dense trench transistor.

16. A trench transistor comprising:
trenches formed within a semiconductor body of a first conductivity type along a first direction and adjacent along a second direction, which is perpendicular to the first direction;
an insulation layer adjoining the semiconductor body within the trenches;
a gate electrode adjoining the insulation layer within the trenches;
mesa zones formed between the trenches, said mesa zones having drift zones of the first conductivity type;
a body zone formed in the mesa zones above the drift zones, the body zone formed of a second conductivity type opposite to the first conductivity type and with body contact zones of the second conductivity type and source zones of the first conductivity type that extend to a surface of the semiconductor body; and
wherein the breakdown is formed in the mesa zones for increasing the avalanche strength below the body contact zones in a depth lying in the region of the trench bottoms, a thickness of the insulation layer is smaller in a bottom region of the trenches that is adjacent to the body contact zones in the second direction than in a bottom region that is adjacent to the source zones in the second direction.

17. The trench transistor of claim 16, wherein the thickness of the insulation layer is smaller by essentially 10% to 40% in a bottom region of the trenches that is adjacent to the body contact zones in the second direction than in a bottom region that is adjacent to the source zones in the second direction.

18. The trench transistor of claim 16, wherein the mesa zones have a smaller width in the region of the body contact zones than in the region of the source zones.

19. The trench transistor of claim 16, wherein:
the semiconductor body comprises a semiconductor substrate and an epitaxial layer of in each case the first conductivity type; and
the dopant concentration in the epitaxial layer is comparatively lower than the dopant concentration in the semiconductor substrate.

20. The trench transistor of claim 16, wherein:
the body zones are formed as far as a penetration depth in the semiconductor body; and
the insulation layer within the trenches is formed such that it is essentially thicker below the penetration depth of the body zones than above the penetration depth.

21. The trench transistor of claim 16, wherein a plurality of electrodes insulated from one another are formed within the trenches.

22. The trench transistor of claim 16, wherein a further electrode for the lateral connection of the body contact zones and of the source zones is formed within the trenches.

* * * * *